United States Patent
Bolender (10) Patent No.: US 7,656,392 B2
(45) Date of Patent: Feb. 2, 2010

(54) TOUCH SENSOR EFFECTIVE AREA ENHANCEMENT

(75) Inventor: Robert J. Bolender, Santa Clara, CA (US)

(73) Assignee: Synaptics Incorporated, Santa Clara, CA (US)

( * ) Notice: Subject to any disclaimer, the term of this patent is extended or adjusted under 35 U.S.C. 154(b) by 690 days.

(21) Appl. No.: 11/388,586

(22) Filed: Mar. 24, 2006

(65) Prior Publication Data

US 2007/0222766 A1 Sep. 27, 2007

(51) Int. Cl.
*G06F 3/041* (2006.01)

(52) U.S. Cl. .................... 345/173; 178/18.01

(58) Field of Classification Search ......... 345/156–178; 178/18.01–18.11
See application file for complete search history.

(56) References Cited

U.S. PATENT DOCUMENTS

| | | | |
|---|---|---|---|
| 4,550,221 A | 10/1985 | Mabusth | |
| 5,159,159 A | 10/1992 | Asher | |
| 5,543,589 A | 8/1996 | Buchana et al. | |
| 6,163,313 A * | 12/2000 | Aroyan et al. | 345/173 |
| 6,188,391 B1 | 2/2001 | Seely et al. | |
| 6,225,678 B1 | 5/2001 | Yach et al. | |
| 6,392,636 B1 | 5/2002 | Ferrari et al. | |
| 6,414,671 B1 * | 7/2002 | Gillespie et al. | 345/157 |
| 6,841,225 B2 * | 1/2005 | Bottari | 345/173 |
| 7,046,230 B2 * | 5/2006 | Zadesky et al. | 345/156 |
| 7,129,935 B2 | 10/2006 | Mackey | |
| 7,202,859 B1 | 4/2007 | Speck et al. | |
| 7,218,124 B1 | 5/2007 | Mackey et al. | |
| 7,307,624 B2 * | 12/2007 | Geaghan et al. | 345/173 |
| 7,327,352 B2 * | 2/2008 | Keefer et al. | 345/173 |
| 2003/0067451 A1 | 4/2003 | Tagg et al. | |
| 2003/0085882 A1 | 5/2003 | Lu | |
| 2003/0161512 A1 | 8/2003 | Mathiassen et al. | |
| 2003/0184527 A1 | 10/2003 | Han | |
| 2004/0055396 A1 | 3/2004 | Morimoto | |
| 2005/0089200 A1 | 4/2005 | Nysaether | |
| 2005/0270273 A1 | 12/2005 | Marten | |
| 2006/0203403 A1 | 9/2006 | Schediwy et al. | |

FOREIGN PATENT DOCUMENTS

| | | |
|---|---|---|
| JP | 2004145761 | 5/2004 |
| JP | 2005128819 | 5/2005 |
| JP | 2005149967 | 6/2005 |

OTHER PUBLICATIONS

International Search Report for PCT/US2007/062933, mailed Jul. 16, 2007.

* cited by examiner

*Primary Examiner*—David L Lewis
(74) *Attorney, Agent, or Firm*—Ingrassia, Fisher & Lorenz, P.C.

(57) ABSTRACT

A touch sensor device is provided that that uses an edge electrode set to provide an improved effective area. Specifically, the touch sensor device includes an edge electrode set that together substantially surround a perimeter of sensing. The edge electrode set increases the effective sensing area of the touch sensor device, and thus can be used to improve the space efficiency of the touch sensor device.

23 Claims, 6 Drawing Sheets

TOUCH SENSOR EFFECTIVE AREA ENHANCEMENT

FIELD OF THE INVENTION

This invention generally relates to electronic devices, and more specifically relates to touch sensor devices.

BACKGROUND OF THE INVENTION

Touch sensor devices (also commonly called touch pads or proximity sensors) are widely used in a variety of electronic systems. A touch sensor device is typically a sensitive surface that uses capacitive, resistive, inductive, optical, acoustic or other technology to determine the presence, location and or motion of one or more fingers, styli, and/or other objects. The touch sensor device, together with a finger or other object provides an input to the electronic system. For example, touch sensor devices are used as input devices for computers, such as notebook computers.

Touch sensor devices are also used in smaller devices, such as personal digital assistants (PDAs) and communication devices such as wireless telephones and text messaging devices. Increasingly, touch sensor devices are used in multimedia devices, such as CD, DVD, MP3, video or other media players. Many electronic devices include a user interface; or UI, and an input device for interacting with the UI. A typical UI includes a screen for displaying graphical and/or textual elements. The increasing use of this type of UI has led to a rising demand for touch sensor devices as pointing devices. In these applications the touch sensor device can function as a cursor control device, selection device, scrolling device, character/handwriting input device, menu navigation device, gaming input device, button input device, keyboard and/or other input device.

One issue in touch sensor device design is the efficient use of available space. In modern electronics, space is at a premium. This is particularly true for small devices, such as portable media players and wireless communication devices. In some previous touch sensor device designs the effective area on a touch sensor device, e.g., the area in which the position of an object can be accurately determined, was limited to a relatively small portion of the actual touch area. For example, in some designs the effective area was limited to approximately the region inside the center of the outermost electrodes. Outside of this area the position of objects cannot be accurately determined. The difference between the actual area of the touch sensor device and the effective area is thus wasted space. The wasted space increases the space required and the cost needed to provide a touch sensor device with a particular effective area. There remains a continuing need for improved touch sensor device designs that can provide improved space efficiency.

BRIEF SUMMARY OF THE INVENTION

The present invention provides a touch sensor device that uses an edge electrode set to provide an improved effective area. Specifically, the embodiments of the present invention use an edge electrode set that together substantially surround a perimeter of sensing electrodes in the touch sensor device. The edge electrode set increases the effective sensing area of the touch sensor device, and thus can be used to improve the space efficiency of the touch sensor device.

The edge electrode set improves the effective sensing area of the touch sensor while requiring a relatively small increase in device complexity. In one embodiment, the edge electrode set comprises one electrode that by itself substantially surrounds the sensing electrodes. In other embodiments, the edge electrode set comprises two or three electrodes that, taken together, surround the sensing electrodes of the touch sensor. In all these cases the sets of edge electrodes provide increased effective area in the sensor while requiring a limited number of additional electrodes and thus a relatively small increase in device complexity. Furthermore, the physical area required by the edge electrode set is significantly smaller than the resulting increase in effective area. Thus, the embodiments of the invention can provide increased effective area while requiring a limited increase in overall device size and complexity.

In one embodiment, the edge electrode set surrounds a mosaic array of sensing electrodes where each electrode is adapted to detect object position in both coordinates of a two-dimensional space. For example, where the sensing electrodes are arranged in a scute pattern and form a circular sensor region. In an alternate embodiment, the edge electrode set surround sensing electrodes arranged in substantially non-parallel axes. For example, electrodes in a row/column configuration arranged to form a rectangular sensor region. Of course, these are simply two examples of the type of touch sensor devices that can be implemented with an edge electrode set to increase the effective sensing area.

BRIEF DESCRIPTION OF DRAWINGS

The preferred exemplary embodiment of the present invention will hereinafter be described in conjunction with the appended drawings, where like designations denote like elements, and.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

The present invention provides a touch sensor device that uses an edge electrode set to provide an improved effective area. Specifically, the embodiments of the present invention use an edge electrode set that together substantially surround a perimeter of sensing electrodes in the touch sensor device. The edge electrode set increases the effective sensing area of the touch sensor device, and thus can be used to improve the space efficiency of the touch sensor device.

Figure 1:
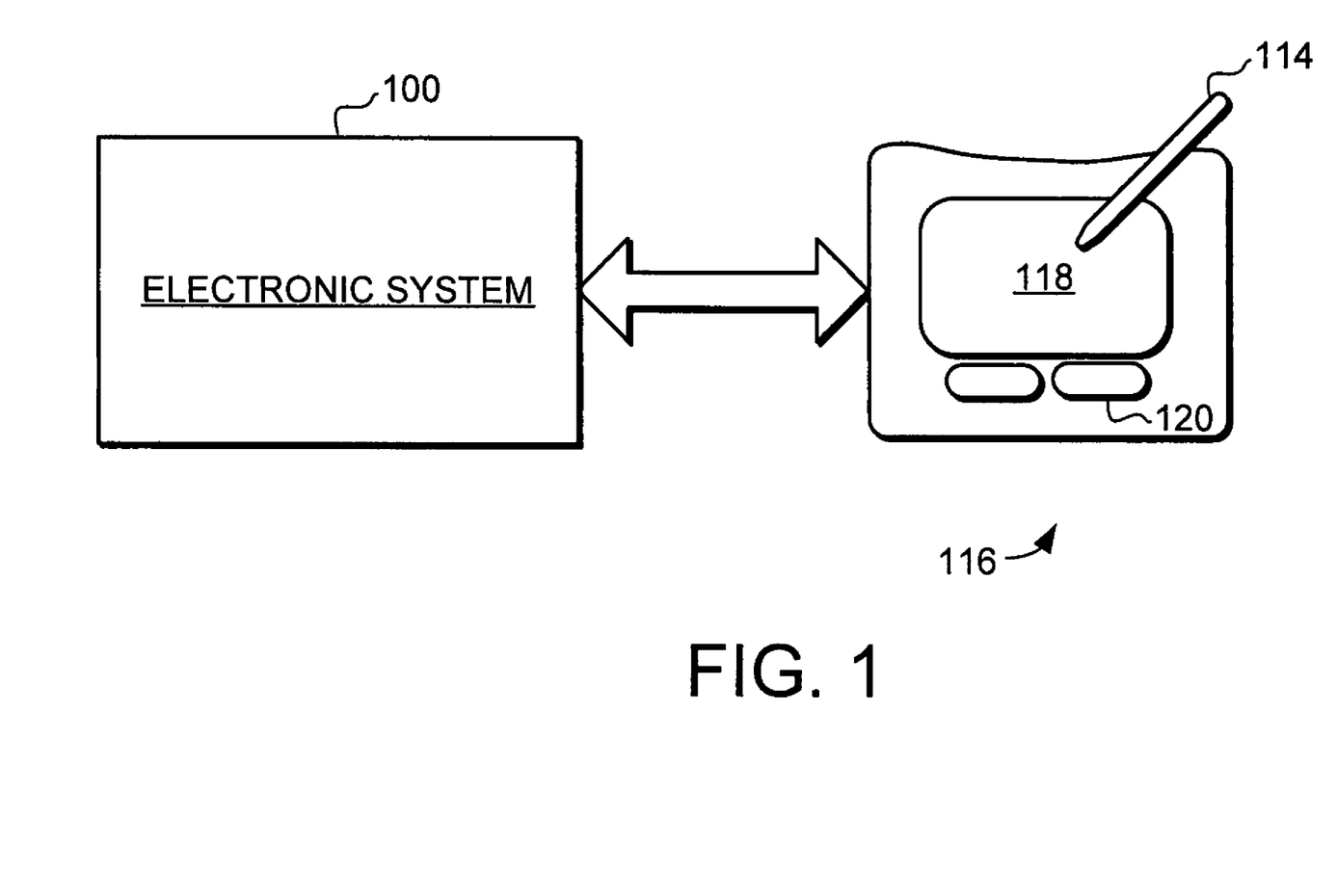
FIG. 1 is a block diagram of an exemplary system that includes a touch sensor device in accordance with an embodiment of the invention.

Turning now to the drawing figures, FIG. 1 is a block diagram of an exemplary electronic system 100 that is coupled to a touch sensor device 116. Electronic system 100 is meant to represent any type of personal computer, portable computer, workstation, personal digital assistant, video game player, telephone, media player or other device capable of accepting input from a user and of processing information. Accordingly, the various embodiments of system 100 may include any type of processor, memory or display. Additionally, the elements of system 100 may communicate via a bus, network or other interconnection. The touch sensor device 116 can be connected to the system 100 through any type of interface or connection, including PS/2, Universal Serial Bus (USB), wireless, or other type of connection to list several non-limiting examples.

Touch sensor device 116 is sensitive to the position of a stylus 114, finger and/or other object within a "touch region" 118, which includes the space above, around, in and/or near the touch sensor device 116 where the sensor of the touchpad is able to detect a position of the object. In a conventional embodiment, the touch sensor device 116 can detect an object in one or more directions for a distance into space until signal-to-noise ratios prevent object detection. This distance may be on the order of centimeters or more, and may vary significantly with the type of position sensing technology used and the accuracy desired.

In operation, touch sensor device 116 suitably detects a position of stylus 114 or other object, and provides electrical or electronic indicia of the position to the electronic system 100. The system 100 appropriately processes the indicia to accept inputs from the user, to move a cursor or other object on a display, or for any other purpose.

The touch sensor device 116 can use a variety of techniques for detecting the presence of an object. As a non-limiting example, the touch sensor device 116 can use capacitive techniques. In a capacitive implementation of a touch sensor, a voltage is typically applied to create an electric field across the sensing surface. A capacitive touch sensor device 116 would then detect the position of an object by detecting changes in capacitance caused by the object. The touch sensor device 116 then delivers position information to the system 100.

In a typical implantation the touch sensor device 116 would include a touch sensor controller coupled to sensing electrodes. In general, the touch sensor controller comprises one or more integrated circuits that receive electrical signals from the sensing electrodes and communicates with the electronic system. The touch sensor controller can also perform a variety of processes on the signals received from the sensing electrodes to implement the touch sensor device 116. For example, the touch sensor controller can select or connect individual sensor electrodes, detect presence/proximity and report a position when a threshold is reached, and/or interpret and wait for a valid tap/stroke/character/button sequence before reporting it to the electronic system 100, or indicating it to the user.

In other embodiments the touch sensor controller passes the signals to the electronic system 100 and the majority of the processing is performed on other processors such as those on the electronic system 100. In this case, the touch sensor controller receives electrical signals from the sensing electrodes and facilitates object sensing by communicating with the electronic system 100. As the term is used in this application, the term "electronic system" broadly refers to any type of device that communicates with touch sensor device 116. The electronic system 100 could thus comprise any type of device in which a touch sensor can be implemented or coupled to. The touch sensor could be implemented as part of the electronic system 100, or coupled to the electronic system using any suitable technique. As non-limiting examples the electronic system 100 could thus comprise any type of computing device, media player, communication device, or another input device (such as another touch sensor or keypad). In some cases the electronic system 100 is itself a peripheral to a larger system. For example, the electronic system 100 could be a data input or output device, such as a remote control or display device, that communicates with a computer or media system (e.g., remote control for television) using a suitable wireless technique. It should also be noted that the various elements (processor, memory, etc.) of the electronic system 100 could be implemented as part of the electronic system 100, as part of the touch sensor, or as a combination thereof. Additionally, the electronic system 100 could be a host or a slave to the touch sensor device 116.

In the illustrated embodiment the touch sensor device 116 is proximate buttons 120. The buttons 120 can be implemented to provide additional input functionality to the touch sensor device 116. For example, the buttons 120 can be used to facilitate selection of items using the touch sensor device 116. Of course, this is just one example of how additional input functionality can be added to the touch sensor device 116, and in other implementations the touch sensor device 116 could include additional input devices. Conversely, the touch sensor device 116 can be implemented with no additional input devices.

It should be noted that although the various embodiments described herein are referred to as "touch sensor devices", "proximity sensors" or "touch pads", these terms as used herein are intended to encompass not only conventional touch sensor devices, but also a broad range of equivalent devices that are capable of detecting the position of a one or more fingers, pointers, styli and/or other objects. Such devices may include, without limitation, touch screens, touch pads, touch tablets, biometric authentication devices, handwriting or character recognition devices, and the like. Similarly, the terms "position" or "object position" as used herein are intended to broadly encompass absolute and relative positional information, and also other types of spatial-domain information such as velocity, acceleration, and the like, including measurement of motion in one or more directions. Various forms of positional information may also include time history components, as in the case of gesture recognition and the like. Accordingly, touch sensor devices appropriately detect more than the mere presence or absence of an object and may encompass a broad range of equivalents.

In the embodiments of the present invention, an edge electrode set is provided to increase the effective area of touch sensor device 116. Specifically, the embodiments of the present invention use an edge electrode set that together substantially surround a perimeter of sensing electrodes in the touch sensor device 116. The edge electrode set increases the effective sensing area of the touch sensor device 116, and thus can be used to improve the space efficiency of the touch sensor device.

Figure 2:
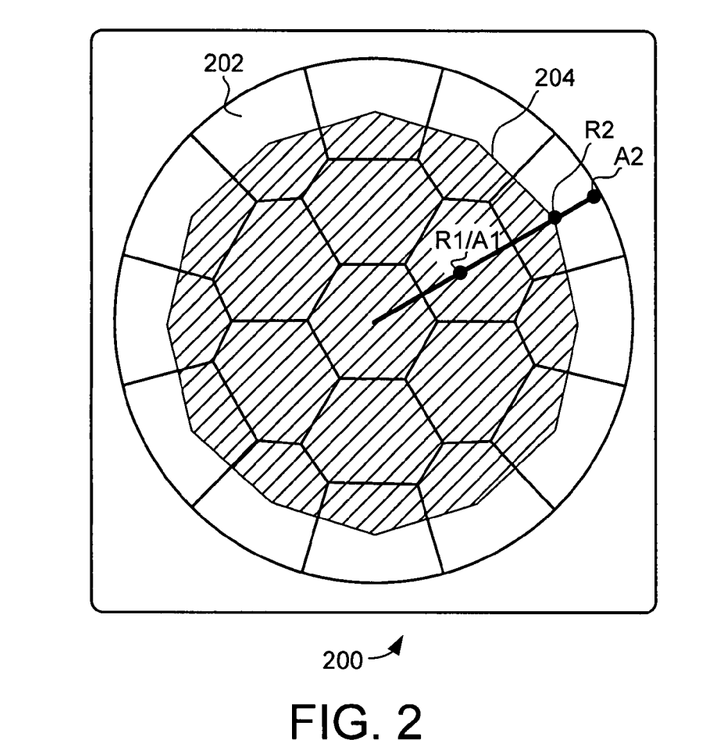
FIG. 2 is a schematic view of a touch sensor device with a mosaic array of sensing electrodes.

Turning now to FIG. 2, an exemplary touch sensor device 200 is illustrated. Touch sensor device 200 is a circular touch sensor that includes a mosaic array of electrodes (e.g., electrode 202) arranged in a "scute" or turtle shell pattern. In a mosaic array of electrodes each electrode participates in reporting the position of a proximate object in both coordinates of two dimensions. This contrasts with other types of touch sensor devices commonly called "row/column" touch sensors. In row/column touch sensors the electrodes are arranged in rows and columns, with the row electrodes reporting the position of a proximate object in one coordinate, and the column electrodes reporting position in the other coordinate.

Figure 3:
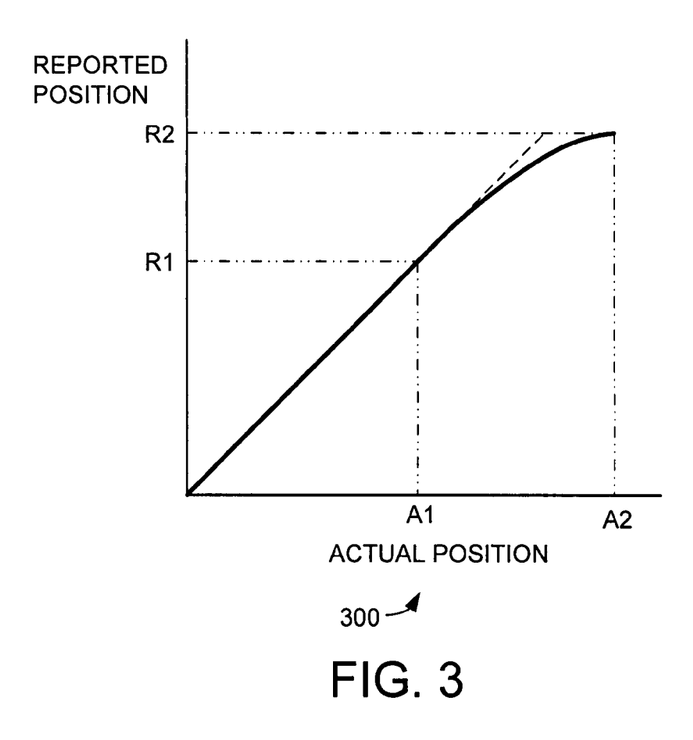
FIG. 3 is a graphical view illustrating reported position versus actual position in a touch sensor device.

In some previous touch sensor device designs the effective area on a touch sensor device, e.g., the area in which the position of an object can be accurately determined, was limited to a relatively small portion of the actual touch area. In FIG. 2, an exemplary limited effective area 204 is illustrated. This effective area 204 corresponds roughly to the region inside the center of the outermost electrodes. The position of objects outside this area cannot be accurately determined. Turning now to FIG. 3, a graph 300 illustrates the reported position as a function of the actual position of the object for the touch sensor device 200. As seen in graph 300, near the center of the touch sensor device 200 the reported position closely tracks the actual position. Thus, the reported position R1 is substantially equal to the actual position A1. However, nearer to the outside edge of the touch sensor device the device exhibits asymptotic behavior. This is caused by the inability of the touch sensor device 200 to report a position approximately beyond the center of the outermost electrodes. Because the touch sensor device 200 is unable to report a position outside its effective area, an object at actual position A2 will instead be reported to be at position R2, where R2 is significantly less than A2. Thus, when an object is outside the effective area, the accuracy of the touch sensor device 200 is greatly degraded. The difference between the actual area of the touch sensor device 200 and the effective area is thus effectively wasted space.

Figure 4:
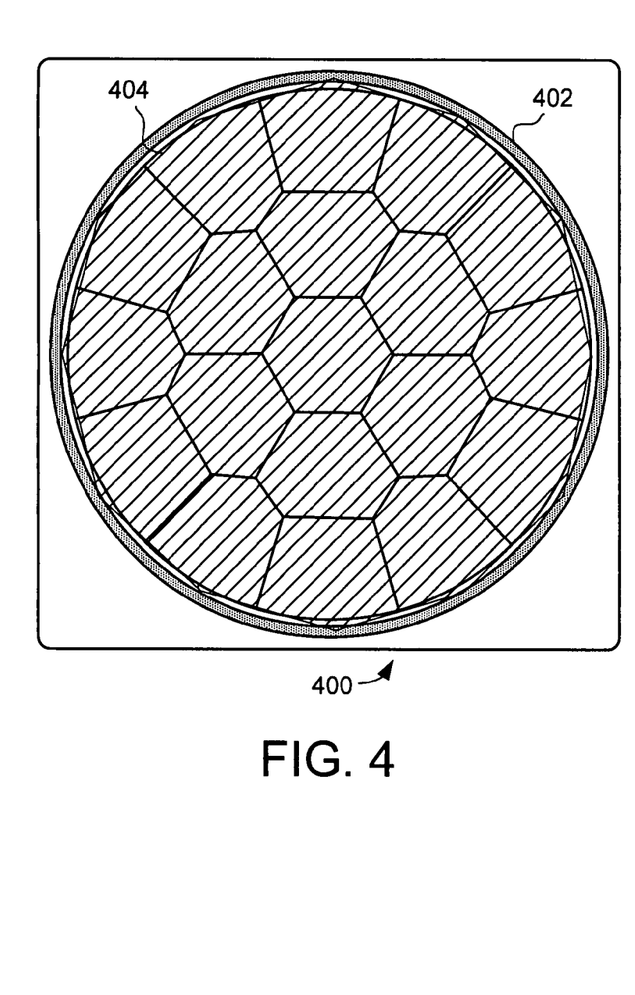
FIG. 4 is a schematic view of a touch sensor device with an edge electrode set in accordance with an embodiment of the invention.

In the embodiments of the present invention, an edge electrode set is provided to increase the effective area of sensor. Turning now to FIG. 4, an exemplary touch sensor device 400 is illustrated. Touch sensor device 400 is again circular touch sensor that includes a mosaic array of electrodes arranged in a "scute" or turtle shell pattern. Again, this is just one example of the type of pattern in which the electrodes can be arranged. For example, the sensing electrodes could have concave or convex features, be simple polygons or have complex shapes, or be arranged in circles or other suitable non-rectangular shapes. Specific examples of touch sensor devices that use mosaic arrays of electrodes can be found at U.S. Pat. No. 4,736,191 to Matzke et al. The configuration, shape and number of sensing electrodes would typically be determined by the sensing requirements of the specific application, and the type of sensing technology being used.

In accordance with an embodiment of the invention, the touch sensor device 400 includes an edge electrode set 402 that substantially surrounds a perimeter of sensing electrodes in the touch sensor device 400. In this illustrated embodiment, the edge electrode set 402 consists of one edge electrode that by itself surrounds the perimeter of the touch sensor device. FIG. 4 also illustrates the improved effective sensing area 404 resulting from the use edge electrode set 402. As illustrated in FIG. 4, the edge electrode set 402 increases the effective sensing area 404 of the touch sensor device, and thus can be used to improve the space efficiency of the touch sensor device.

The edge electrode set 402 improves the effective sensing area 404 of the touch sensor while requiring a relatively small increase in device complexity. Specifically, in this illustrated embodiment, the edge electrode set consists of one electrode and thus would require only one more connection to the touch sensor controller. It should also be noted that the physical area required by the edge electrode set 402 can be relatively small, and thus can be significantly smaller than the resulting increase in effective area 404. Thus, the edge electrode set 402 provides increased effective area 404 while requiring a limited increase in overall device size and complexity.

The edge electrode set 402 is adapted to provide position information for devices proximate to the touch sensor device. Thus, the edge electrode set 402 can be connected with the touch sensor controller in the same or similar manner as the sensing electrodes in the device. Furthermore, the edge electrode set 402 can be fabricated using the same or similar techniques as those used to fabricate the sensing electrodes. For example, the edge electrodes 402 and sensing electrodes can be fabricated using conductive ink printing, such as screen, ink jet, or offset/transfer printing. In other examples, the edge electrode set 402 and sensing electrodes can be metallic conductors patterned on a circuit substrate by deposition, etching, molding, stamping, and/or other patterning methods.

In many embodiments, it is desirable for each edge electrode in the edge electrode set 402 to have an area that is substantially equal to an area of one of the sensing electrodes. This reduces the complexity of incorporating proximity information for the edge electrodes into the information provided from the sensing electrodes. Specifically, it is typically easier to balance the sensor when all the electrodes, including the edge electrodes, have similar operating characteristics. Similarly, in row/column type sensors it would typically be desirable for each edge electrode to have an area substantially equal to the area of a row or column electrode.

However, it should be noted that in most cases it would be desirable to make the edge electrodes relatively thin, thus extending the radius of the touch sensor device 400 a relatively small amount. The advantage of making the edge electrodes relatively thin is that expanded effective sensor area will typically extend to approximately the middle of the edge electrode's thickness. Thus, the thinner an edge electrode, the less "wasted space" that will occur outside the expanded effective area, and thus the greater the improvement relative to the overall size increase. For example, if the outer sensing electrode is 5 mm wide, the effective area extends only to its midpoint, at 2.5 mm. By adding a 0.6 mm wide edge electrode outside a 0.2 mm gap, the effective sensing area is increased by 3 mm (the other half of the 5 mm outer sensing electrode, plus the 0.2 mm gap, plus half of width of the edge electrode, 0.3 mm). Thus, an increase in sensing dimension of 3 mm is achieved by only adding 0.8 mm of electrode and gap.

Touch sensor devices can use a variety of different position determination algorithms. As one example, the location of object proximate a traditional touch sensor device, expressed as two coordinates X and Y can be determined as:

$$X = \frac{\sum x_i s_i}{\sum s_i} \quad (1.)$$

$$Y = \frac{\sum y_i s_i}{\sum s_i}$$

Where there are i electrodes, $x_i$ and $y_i$ are the coordinates of each electrode, and $s_i$ is the signal strength for each electrode.

Adding the edge electrode set 404 provides one or more new electrodes from which position information is provided. In one embodiment, the edge electrodes will be used to determine the radial position of the object, but will not be used to determine the angular position. For example, in the touch sensor 400 illustrated in FIG. 4, the location of the object can now be calculated as:

$$X_c = \frac{\sum_j x_j s_j}{\sum_j s_j} \quad (2.)$$

$$Y_c = \frac{\sum_j y_j s_j}{\sum_j s_j}$$

$$\theta = \arctan\left(\frac{Y_c}{X_c}\right)$$

$$R_k = \omega_k r_k$$

$$R = \frac{\sum_k R_k s_k}{\sum_k s_k}$$

Where there are j sensing electrodes (excluding edge electrodes) and k electrodes total (including both edge and sensing electrodes), r is the distance from the center of the pad to the center of each electrode, ω is the weighting factor of each electrode, and s is the signal strength of each electrode. The first two equations calculate preliminary object location coordinates $X_c$ and $Y_c$ as a function of the signals measured in the sensing electrodes only. The third equation calculates the angular position θ as a function of the preliminary objection location coordinates. Thus, the angular position θ is calculated without the use of the edge electrodes. The fourth equation calculates a weighted radius $R_k$ used to calculate the radial position. The fifth equation calculates the radial position R as a function of the weighted radius and the signals measured at all the electrodes, including the edge electrodes. Thus, the edge electrodes are used to provide radial information, extending the radius of the effective sensing area, but are not used to calculate angular information. Optimization can be performed by varying the $r_k$ used for each electrode as well as varying the weighting $\omega_k$ assigned to each electrode to produce an optimal reported position versus actual finger position. It should be noted that while this example outputs position information in form of radial information R and angular position θ, this is just one example, and other systems can use different techniques.

For example using the radial position R and preliminary object location coordinates $X_c$ and $Y_c$ as calculated in equation 2, the objection position information can be calculated and reported in rectangular coordinates X and Y as follows:

$$X = \frac{RX_c}{\sqrt{X_c^2 + Y_c^2}} \quad (3.)$$

$$Y = \frac{RY_c}{\sqrt{X_c^2 + Y_c^2}}$$

In this example, the edge electrodes are again used in calculating the radial position R, but are not used in calculating the preliminary object location coordinates $X_c$ and $Y_c$. However, the effects of all electrodes, including both sensing and edge electrodes, are used to calculate the final object position X and Y.

Of course these are just two examples of how position information from the edge electrode set can be combined with position information from the sensing electrodes to determine a position of an object proximate the touch sensor device.

As one other example, the edge electrode set can be used in peak detection sensing method. In one example of peak detection, the capacitance at each electrode is measured and a curve fitting technique is applied to the measured capacitance. A peak detection method is then used to determine the peak of the curve. The peak of the curve corresponds to the point of greatest signal strength on the touch sensor, and is thus used as the reported position of the object. In the embodiments of the invention, peak detection techniques can be used with touch sensor devices that include an edge electrode set. In those cases capacitance of the edge electrode set is measured along with the sensing electrodes, and curve fitting and peak detection is performed to locate the position of the object.

Figure 5:
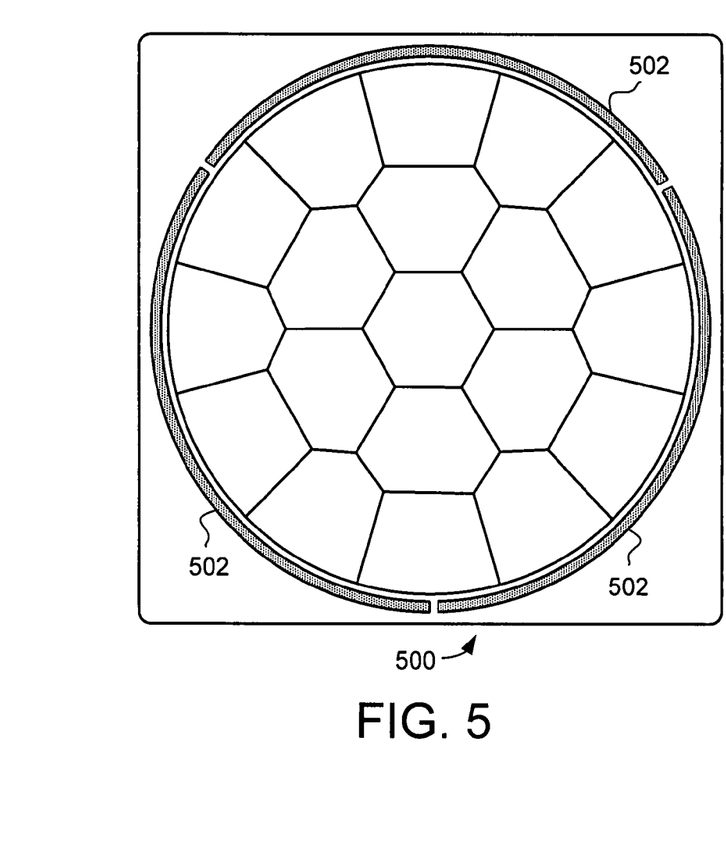
FIG. 5 is a schematic view of a touch sensor device with an edge electrode set in accordance with an embodiment of the invention.

As stated above, the edge electrode set comprises one electrode that by itself substantially surrounds the sensing electrodes. In other embodiments, the edge electrode set comprises two or three electrodes that, taken together, substantially surround the sensing electrodes of the touch sensor device. Turning now to FIG. 5, a second embodiment of touch sensor device 500 is illustrated. In this embodiment, the touch sensor device 500 includes an edge electrode set that consists of three edge electrodes 502. The three edge electrodes 502, taken together, substantially surround the sensing electrodes of the touch sensor device 500. The edge electrode set 502 again provides increased effective area in the sensor while requiring a limited number of additional electrodes and thus a relatively small increase in device complexity.

Figure 6:
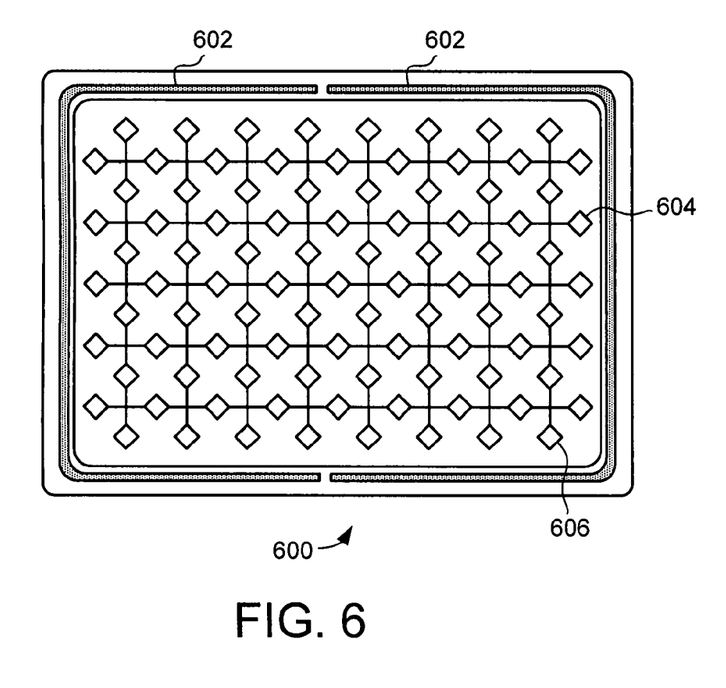
FIG. 6 is a schematic view of a touch sensor device with an edge electrode set in accordance with an embodiment of the invention.

As described above, the edge electrode set can be implemented in a variety of different types of touch sensor devices. FIGS. 4 and 5 illustrate implementations in touch sensor devices that use a mosaic array of sensing electrodes where each electrode is adapted to detect object position in both coordinates of a two-dimensional space. Other types of touch sensor devices use different sensing electrode arrangements, for example "row/column" touch sensors. Turning now to FIG. 6, an exemplary row/column type touch sensor device 600 is illustrated. In row/column touch sensors the electrodes are arranged in rows 604 and columns 606, with the row electrodes 604 reporting the position of a proximate object in one coordinate, and the column electrodes 606 reporting position in the other coordinate. It should be noted that the "rows" and "columns" do not need to be perpendicular to each other. Instead, they can be implemented along any two substantially non-parallel axes. Specific examples of row/column touch sensor devices can be found at U.S. Pat. No. 6,188,391 to Seely et al.

The row/column touch sensor 600 includes an edge electrode set that consists of two edge electrodes 602. Again, the two edge electrodes 602, taken together, substantially surround the sensing electrodes of the row/column touch sensor device 600. The edge electrode set 602 again provides increased effective area in the sensor while requiring a limited number of additional electrodes and thus a relatively small increase in device complexity.

Figure 7:
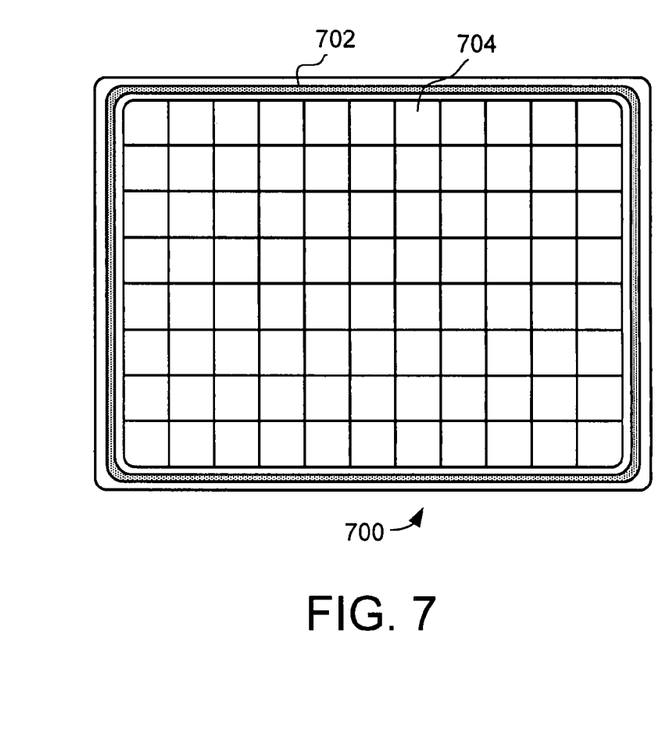
FIG. 7 is a schematic view of a touch sensor device with an edge electrode set in accordance with an embodiment of the invention.

The embodiments of the present invention can be applied to a variety of different touch sensors devices having a variety of different shapes. Turning now to FIG. 7 a third embodiment of a touch sensor device 700 is illustrated. In this embodiment, the touch sensor device 700 again comprises a rectangular touch sensor that uses a mosaic array of sensing electrodes 704 where each electrode is adapted to detect object position in both coordinates of a two-dimensional space. The touch sensor device 700 includes an edge electrode set that consists of one edge electrode 702. Again, the edge electrode 702 substantially surrounds the mosaic array of sensing electrodes 704 to provide increased effective area in the sensor.

Figure 8:
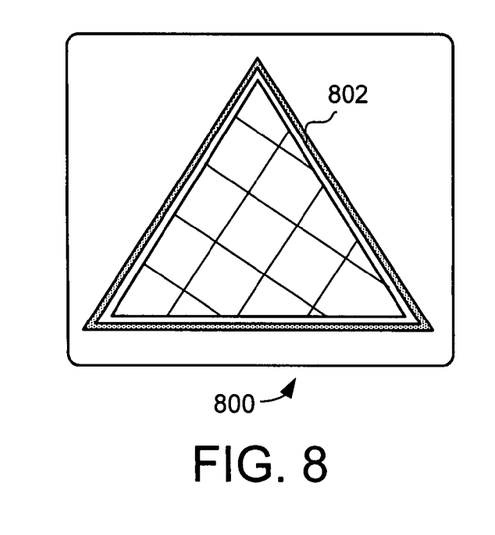
FIG. 8 is a schematic view of a touch sensor device with an edge electrode set in accordance with an embodiment of the invention.

Turning now to FIG. 8, a fourth embodiment of a touch sensor device 800 is illustrated. In this embodiment, the touch sensor device has a triangular shape, and again includes an edge electrode 802. Again, it should be note that the circular, rectangular, and triangular shaped touch sensor devices illustrated in the various figures are merely exemplary of the types of touch sensor devices that can be implemented with the embodiments of the present invention.

Figure 9:
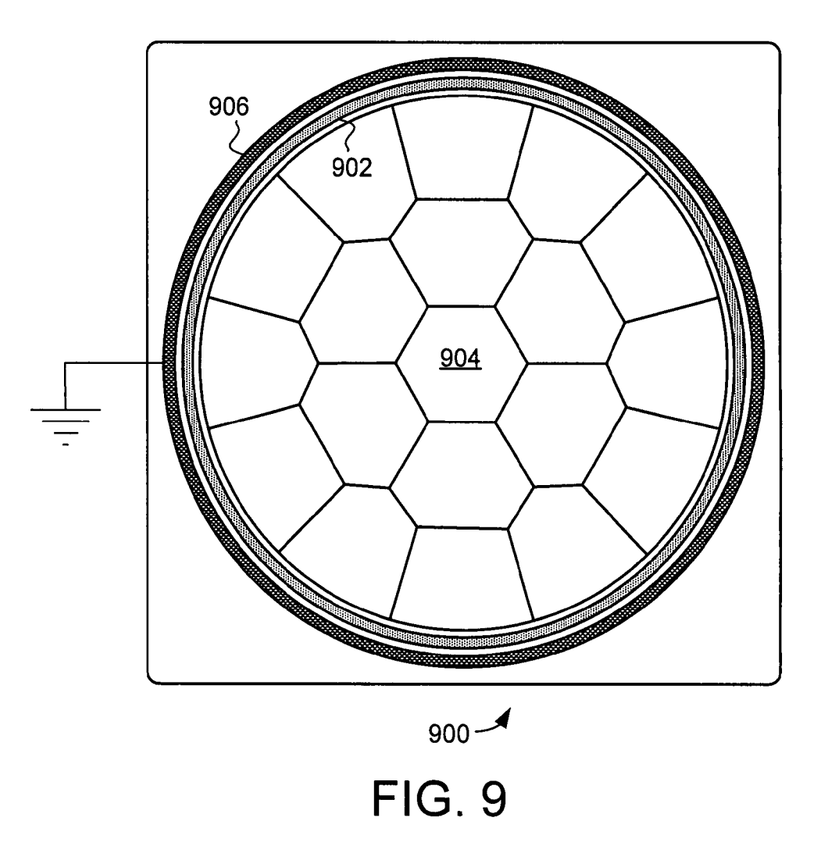
FIG. 9 is a schematic view of a touch sensor device with an edge electrode set in accordance with an embodiment of the invention.

In some embodiments, the edge electrode set is combined with an electrostatic discharge (ESD) protection electrode. Turning now to FIG. 9, a fifth embodiment of a touch sensor device 900 is illustrated. In this embodiment, the touch sensor device includes an edge electrode set 902 surrounding sensing electrodes 904. Again, the edge electrode set 902 provides increased effective area in the touch sensor device 900. In this embodiment the touch sensor device 900 also includes an ESD protection electrode 906. The ESD protection electrode 906 surrounds the edge electrode set 902. The ESD protection electrode 906 provides a path for unwanted charge to be discharged away from sensitive components. As such, the ESD protection electrode is preferably grounded, and thus does not provide any position information to the touch sensor device.

Figure 10:
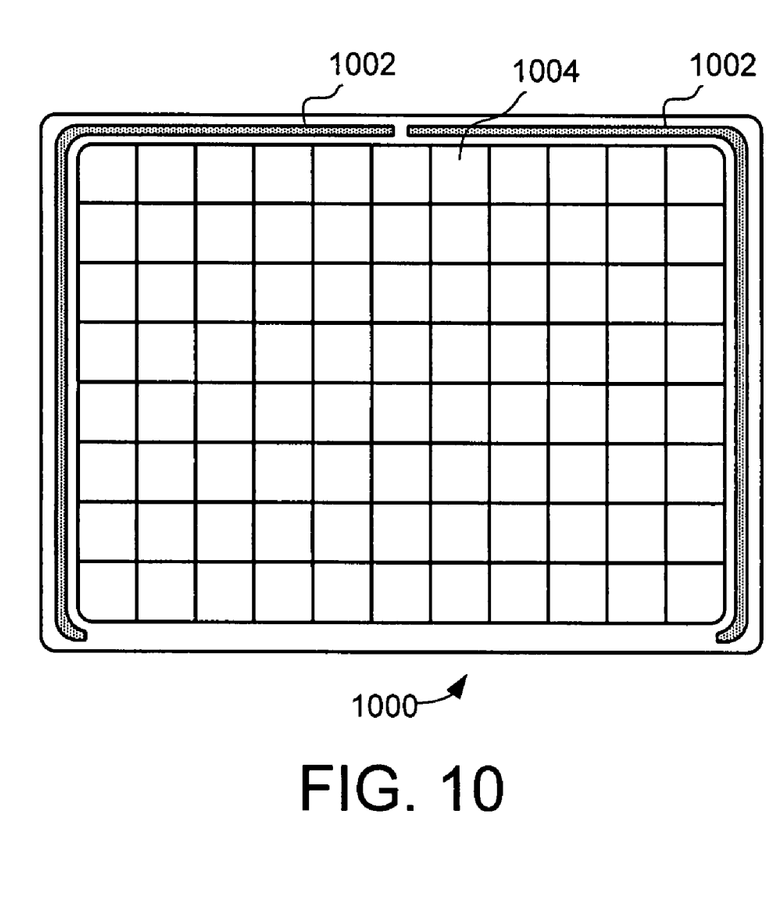
FIG. 10 is a schematic view of a touch sensor device with an edge electrode set in accordance with an embodiment of the invention.

In some embodiments, the edge electrode set surrounds only a portion of sensing electrodes perimeter. Turning now to FIG. 10, a fifth embodiment of a touch sensor device 1000 is illustrated. -The touch sensor device 1000 includes an edge electrode set 1002 partially surrounding sensing electrodes 1004. Specifically, the set of electrodes 1002 consists of two edge electrodes that together surround a portion of the perimeter. This type of embodiment maybe desirable in situations where it is desirable to expand effective area of the touch sensor in only certain directions. Thus, the effective area is expanded in areas where the edge electrodes are provided, but not expanded in other areas. A variety of different implementations can be used. For example, one edge electrode that surrounds at least 50% of the sensing electrode perimeter can be used. As another example, one or two edge electrodes that together surround at least 75% of the sensing electrodes can be used. In both cases the one or two edge electrodes can surround one or more sides of the sensing electrode perimeter, while not surrounding other portions of sensing electrode perimeter.

The embodiments of the present invention thus provide a touch sensor device that uses an edge electrode set to provide an improved effective area. Specifically, the embodiments of the present invention use an edge electrode set that together substantially surrounds a perimeter of sensing electrodes in the touch sensor device. The edge electrode set increases the effective sensing area of the touch sensor device, and thus can be used to improve the space efficiency of the touch sensor device. The invention is intended to be able to help improve the detection of finger position in any number of coordinates and dimensions, such as three coordinates for three dimensional space.

The embodiments and examples set forth herein were presented in order to best explain the present invention and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed. Many modifications and variations are possible in light of the above teaching without departing from the spirit of the forthcoming claims.

What is claimed is:

1. A touch sensor device, the touch sensor device comprising:
   a set of sensing electrodes; and
   an edge electrode set, the edge electrode set consisting of between one to three edge electrodes inclusive, the edge electrode set substantially surrounding a perimeter of the set of sensing electrodes, wherein the set of sensing electrodes is adapted to detect object position proximate the set of sensing electrodes in two dimensions, and wherein the edge electrode set is adapted to detect object position proximate the perimeter of the set of sensing electrodes.

2. The touch sensor device of claim 1 wherein the edge electrode set is adapted to provide increased effective sensing area of the touch sensor device.

3. The touch sensor device of claim 1 wherein the set of sensing electrodes comprises capacitive sensing electrodes.

4. The touch sensor device of claim 1 wherein the set of sensing electrodes together create a substantially circular effective sensing area.

5. The touch sensor device of claim 1 wherein the set of sensing electrodes together create a substantially rectangular effective sensing area.

6. The touch sensor device of claim 1 wherein the set of sensing electrodes comprises a mosaic array of sensing electrodes, wherein each electrode in the mosaic array of sensing electrodes is adapted to detect object position in both coordinates of a two-dimensional space.

7. The touch sensor device of claim 1 wherein the set of sensing electrodes comprises a first plurality of electrodes along a first axis, and a second plurality of electrodes along a second axis, wherein the first axis and the second axis are substantially non-parallel.

8. The touch sensor device of claim 1 wherein electrodes in the set of sensing electrodes are configured in rows and columns.

9. The touch sensor device of claim 1 wherein the set of sensing electrodes is configured in a scute pattern.

10. The touch sensor device of claim 1 wherein the edge electrode set consists of one electrode, where the one electrode is shaped to substantially surround the perimeter of the set of sensing electrodes.

11. The touch sensor device of claim 1 wherein each sensing electrode in the set of sensing electrodes has an area, and wherein each edge electrode in the edge electrode set has an area, and wherein the area of at least one edge electrode in the edge electrode set is substantially equal to the area of at least one sensing electrode.

12. A touch sensor device, the touch sensor device comprising:
   a contiguous set of sensing electrodes, the contiguous set of sensing electrodes adapted to capacitively detect object position proximate the contiguous set of sensing electrodes in both coordinates of a two-dimensional space, the electrodes of the contiguous set of sensing electrodes configured together to define a region having a perimeter; and
   an edge electrode set, the edge electrode set consisting of between one and three edge electrodes inclusive that substantially surround the perimeter, wherein the edge electrode set is adapted to capacitively detect object position proximate the perimeter to increase an effective sensing area of the touch sensor device.

13. The touch sensor device of claim 12 wherein the region comprises a substantially circular effective sensing area.

14. The touch sensor device of claim 12 wherein the region comprises a substantially rectangular effective sensing area.

15. The touch sensor device of claim 12 wherein the contiguous set of sensing electrodes is configured in a scute pattern.

16. The touch sensor device of claim 12 wherein the edge electrode set consists of one electrode, where the one electrode is shaped to substantially surround the perimeter.

17. The touch sensor device of claim 12 wherein each sensing electrode in the contiguous set of sensing electrodes has an area, and wherein each edge electrode in the edge electrode set has an area, and wherein the area of at least one edge electrode is substantially equal to the area of at least one sensing electrode.

18. A touch sensor device, the touch sensor device comprising:
   a set of sensing electrodes; and
   an edge electrode set, the edge electrode set consisting of at most two edge electrodes, the edge electrode set surrounding at least 75% of a perimeter of the set of sensing electrodes, wherein the set of sensing electrodes is adapted to detect object position proximate the set of sensing electrodes in two dimensions, and wherein the edge electrode set is adapted to detect object position proximate the perimeter of the set of sensing electrodes.

19. A touch sensor device, the touch sensor device comprising:
   a set of sensing electrodes; and
   an edge electrode, the edge electrode surrounding at least 50% of a perimeter of the set of sensing electrodes, wherein the set of sensing electrodes is adapted to detect object position proximate the set of sensing electrodes in two dimensions, and wherein the edge electrode is adapted to detect object position proximate the perimeter of the set of sensing electrodes.

20. A method of detecting object position proximate a set of sensing electrodes, the method comprising:
   providing an edge electrode set that substantially surrounds a perimeter of the set of sensing electrodes, the edge electrode set consisting of one to three edge electrodes; and
   using the edge electrode set to increase an effective sensing area of a touch sensor array device by detecting object proximity along the perimeter of the set of sensing electrodes.

21. The method of claim 20 wherein the step of using the edge electrode set to increase an effective sensing area of the touch sensor array device by detecting object proximity along the perimeter of the set of sensing electrodes comprises calculating radial position information of an object using measurements from the edge electrode set.

22. The method of claim 20 wherein the step of using the edge electrode set to increase an effective sensing area of the touch sensor array device by detecting object proximity along the perimeter of the set of sensing electrodes comprises weighting measurements from the edge electrode set using at least one weighting factor selected to increase accuracy of the reported position.

23. The method of claim 20 wherein the step of providing an edge electrode set that substantially surrounds a perimeter of the set of sensing electrodes comprises providing an edge electrode set that consists of one electrode, where the one electrode is shaped to substantially surround the perimeter of the set of sensing electrodes.

* * * * *

UNITED STATES PATENT AND TRADEMARK OFFICE
CERTIFICATE OF CORRECTION

PATENT NO.        : 7,656,392 B2
APPLICATION NO. : 11/388586
DATED             : February 2, 2010
INVENTOR(S)       : Robert J. Bolender It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 985 days.

Signed and Sealed this

Thirtieth Day of November, 2010

David J. Kappos
*Director of the United States Patent and Trademark Office*